United States Patent
Chao et al.

(10) Patent No.: US 6,781,428 B2
(45) Date of Patent: Aug. 24, 2004

(54) INPUT CIRCUIT WITH SWITCHED REFERENCE SIGNALS

(75) Inventors: Chi-Yeu Chao, Hillsboro, OR (US); Gregory F. Taylor, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 81 days.

(21) Appl. No.: 09/894,188

(22) Filed: Jun. 27, 2001

(65) Prior Publication Data

US 2003/0001644 A1 Jan. 2, 2003

(51) Int. Cl.[7] .................... H03K 3/037; H03K 17/62
(52) U.S. Cl. .................... 327/206; 327/407; 327/72
(58) Field of Search .................... 327/205, 206, 327/72–77, 89, 407, 408

(56) References Cited

U.S. PATENT DOCUMENTS

| | | | |
|---|---|---|---|
| 4,775,807 A | * 10/1988 | Bukowski, Jr. | 327/72 |
| 5,155,386 A | * 10/1992 | Abdi | 327/74 |
| 5,528,172 A | * 6/1996 | Sundstrom | 327/76 |
| 6,137,320 A | 10/2000 | Takai | |
| 6,157,203 A | 12/2000 | Takahashi | |
| 6,377,108 B1 | * 4/2002 | Kennedy et al. | 327/407 |

OTHER PUBLICATIONS

Marshall et al., US patent application Publication 2003/0025544, Feb. 6, 2003.*

* cited by examiner

*Primary Examiner*—My-Trang Nuton
(74) *Attorney, Agent, or Firm*—Blakely, Sokoloff, Taylor & Zafman LLP

(57) ABSTRACT

An input circuit includes a comparator circuit and a multi-reference circuit. The input circuit receives an input signal and generates an output signal as a function of the input signal and a reference signal received from the multi-reference circuit. The comparator circuit detects a crossing of the input signal relative to the reference signal and causes a corresponding transition of the output signal. In response to the transition of the output signal, the multi-reference circuit provides a different reference signal to the comparator circuit. The reference signals provided by the multi-reference circuit are selected to create hysteresis in the operation of the input circuit.

29 Claims, 5 Drawing Sheets

INPUT CIRCUIT WITH SWITCHED REFERENCE SIGNALS

TECHNICAL FIELD

This disclosure relates generally to integrated circuits, and in particular but not exclusively, relates to input circuits.

BACKGROUND

A typical integrated circuit includes input circuits to receive signals from other parts of the integrated circuit and to output them with "restored" voltage levels and the appropriate driving current for the circuitry receiving the output signal of the input circuit. As is well known, a variety of sources may inject noise into the signal received by the input circuit. For example, sources include ringing caused by mismatched output drivers or interconnect impedance, signal cross-coupling, and power supply noise. This noise can cause an input circuit to improperly output the received signal.

One conventional solution to this noise problem is create hysteresis in the input circuit by changing the relative "strength" of pull-up and pull-down paths in the input circuit, as a function of the logic level of the output signal generated by the input circuit (e.g., a Schmitt trigger circuit). However, this solution tends to be sensitive to process, temperature and voltage (PVT) variations and, further, tends to be relatively slow.

BRIEF DESCRIPTION OF THE DRAWINGS

Non-limiting and non-exhaustive embodiments of the present invention are described with reference to the following Figures, wherein like reference numerals refer to like parts throughout the various views unless otherwise specified.

DETAILED DESCRIPTION OF THE ILLUSTRATED EMBODIMENTS

Embodiments of a circuit and method for receiving and input signal are described herein. In the following description, numerous specific details are set forth (such as, for example, the components/functional units of a microprocessor) to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In one aspect of the present invention, an input circuit includes a comparator circuit and a multi-reference circuit. The input circuit receives an input signal and generates an output signal as a function of the input signal and a reference signal received from the multi-reference circuit. In one embodiment, the comparator circuit includes a differential pair, which allows the comparator circuit to be relatively fast (e.g., compared to Schmitt trigger circuits). In particular, the comparator circuit detects a crossing of the input signal relative to the reference signal and causes a corresponding transition of the output signal. Further, in accordance with this aspect of the invention, in response to the transition of the output signal, the multi-reference circuit provides a different reference signal to the comparator circuit. The reference signals provided by the multi-reference circuit are selected to create hysteresis in the operation of the input circuit. This aspect allows the input circuit to be relatively fast while reducing the input circuit's sensitivity to noise.

The present invention is described below in the context of a bus input circuit of a microprocessor; however, in light of the present disclosure, those of ordinary skill in the art will understand that the methods and apparatus of the present invention are generally applicable to input circuits for signals other than bus signals and to IC devices other than microprocessors.

Figure 1:
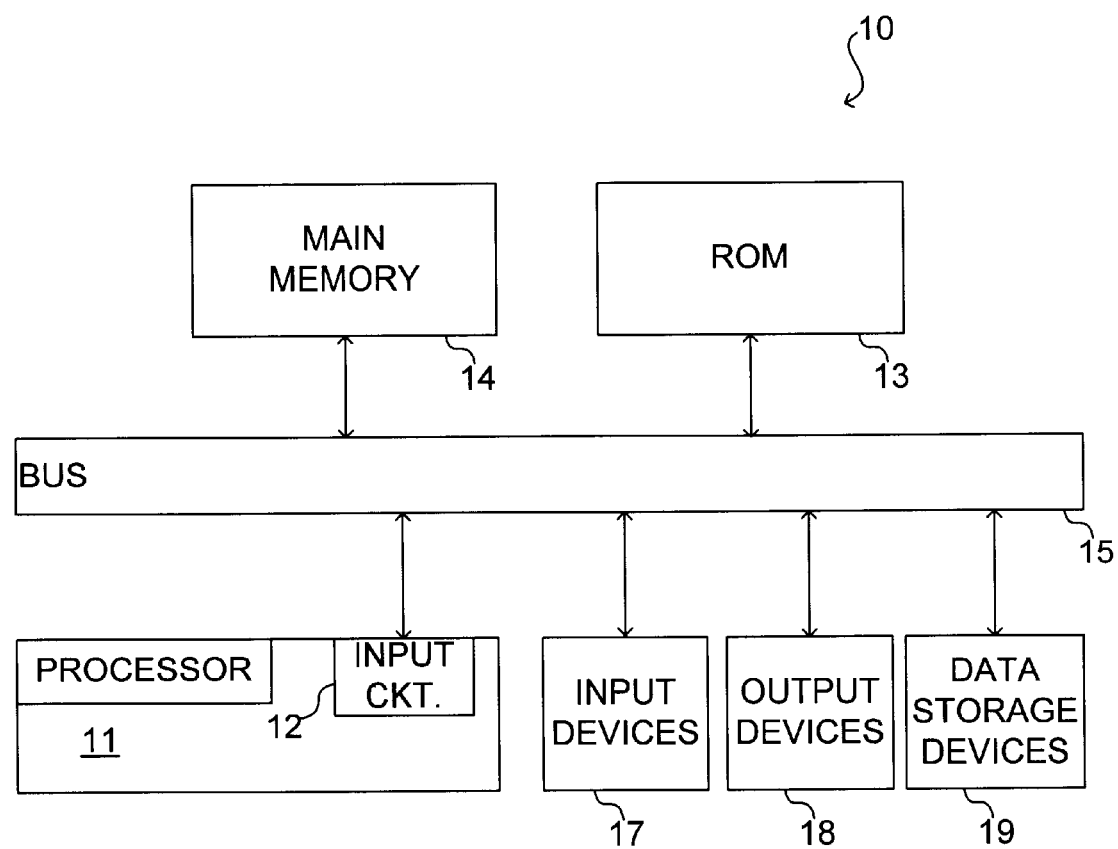
FIG. 1 is a block diagram illustrating a computer system incorporating an input circuit according to one embodiment of the present invention.

Shown schematically in FIG. 1 is a computer system 10 incorporating a processor 11 with an input circuit 12 according to the present invention. This embodiment of computer system 10 also includes a read only memory (ROM) 13, a main memory 14, a bus 15, one or more input devices 17, one or more output devices 18 and one or more data storage devices 19. In this exemplary embodiment, input circuit 12 is connected to receive a bus signal from bus 15. In accordance with the present invention, processor 11 can have a large number of input circuits identical to input circuit 12 connected to receive other signals from bus 15 and other circuits within or external to processor 11. Various embodiments of input circuit 12 are described below in conjunction with FIGS. 3–7.

Processor 11 is coupled via bus 15 to main memory 14, which may include one or more dynamic random access memory (DRAM) devices for storing information and instructions to be executed by processor 11. Main memory 14 may also be used for storing temporary variables or other intermediate information during execution of instructions by processor 11. ROM 13, for storing static information and instructions for processor 11, is coupled to processor 11 via bus 15.

Input devices 17, such as a keyboard or mouse, are coupled to processor 11 through bus 15. Output devices 18 are also coupled to processor 11 via bus 15. Typical output devices 18 include printers and display monitors. Storage devices 19 are also coupled to processor 11 via bus 15. Common data storage devices include hard disk drives, floppy disk drives, and CD ROM drives. In light of this disclosure, those of ordinary skill in the art will understand that computer system 10 may include other components and subsystems in addition to those shown and described with respect to FIG. 1. By way of example, computer system 10 may include video memory, cache memory, as well as other dedicated memory, and additional signal lines and busses.

Figure 2:
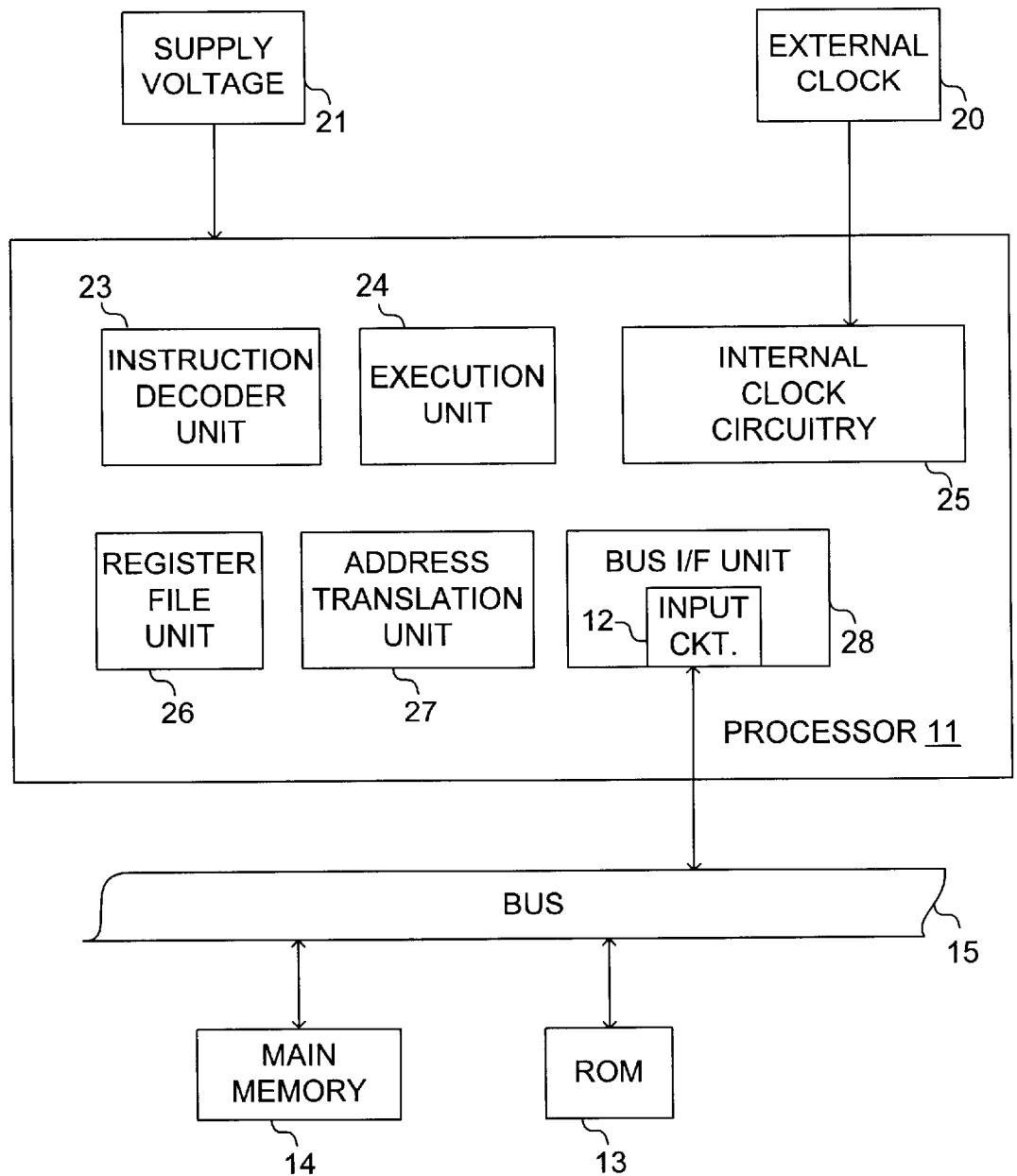
FIG. 2 is a block diagram illustrating the processor of FIG. 1, according to one embodiment of the present invention.

FIG. 2 illustrates an embodiment of processor 11 (FIG. 1), which is coupled to external clock source 20 and a supply voltage source 21. This embodiment of processor 11 includes an instruction decoder unit 23, an execution unit 24, internal clock circuitry 25, register file unit 26, address translation unit 27 and bus interface unit 28. In this embodiment, input circuit 12 is part of bus interface unit 28. In one embodiment, supply voltage source 21 and external clock source 20 respectively provide a supply voltage VCC and a system clock SCLK to processor 11.

The embodiment of processor 11 presented in FIG. 2 is illustrative. In light of this disclosure, those of ordinary skill in the art will understand that, in practice, a modern processor is generally more complex and may include additional components, such as internal cache, which have been omitted for ease of understanding. To improve clarity, FIG. 2 does not show internal buses and other communication paths that electrically interconnect internal clock circuitry 25 and various functional units of processor 11 (e.g., instruction decode unit 23, execution unit 24, register file unit 26, address translation unit 27, and bus interface unit 28). In addition, FIG. 2 does not show other input circuits substantially similar to input circuit 12 that may be used to receive other signals. Accordingly, processor 11 is presented without limitation, and the present invention is generally applicable to all types of processors (e.g., microprocessors, microcontrollers, digital signal processors, etc.), irrespective of the specific architecture employed.

Bus interface unit 28 is coupled to bus 15, as well as main memory 14 and ROM 13. As previously mentioned, bus interface unit 28 includes input circuit 12 (and substantially identical input circuits for other lines of bus 15) for receiving signals via bus 15. Bus interface unit 28 facilitates transmission of data between main memory 14 and processor 11, and performs fetching of instructions and other data from ROM 13. Address translation unit 27 performs memory management for processor 11. Specifically, address translation unit stores the memory addresses (whether in main memory 14, internal cache, or other memory) of data being used by the processor 11 during operation. Instruction decoder unit 23 decodes instructions and other control signals received by processor 11.

Execution unit 24 is intended to present a broad category of microprocessor functional units providing a wide range of functions. By way of example, execution unit 24 may comprise an arithmetic and logic unit for performing arithmetic operations, including shifts, addition, subtraction, multiplication, and division. Register file unit 26 may comprise one or more types of registers for storing data being used by processor 11. For example, register file unit 26 may include integer registers, status registers, instruction pointer registers, and floating point registers, as well as others. If present, the internal cache (not shown) may be used, for example, to store data and control signals from main memory 14.

External clock 20 provides a clock signal having an external clock frequency to internal clock circuitry 25.

Internal clock circuitry 25, which may comprise a phase lock loop (PLL) circuit, adjusts the external clock frequency (either increasing or decreasing this frequency) to achieve a desired operating frequency for processor 11.

Figure 3:
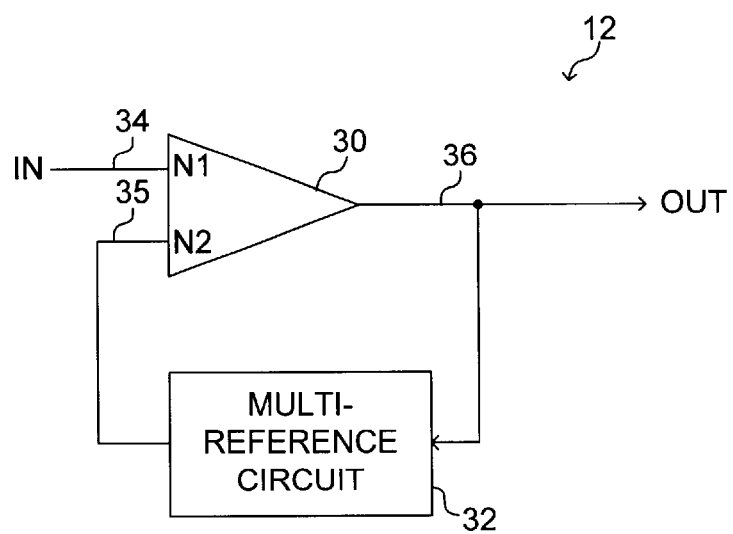
FIG. 3 is a block diagram illustrating an input circuit according to one embodiment of the present invention.

FIG. 3 illustrates input circuit 12 (FIG. 2), according to one embodiment of the present invention. In this embodiment, input circuit 12 includes a comparator circuit 30 and a multi-reference circuit 32. In one embodiment, comparator circuit 30 is implemented using a sense amplifier circuit that generates an output signal as a function of the input signal. For example, comparator circuit 30 can generate the output signal to be an inverted or non-inverted version of the input signal, as desired for the application. In this embodiment, multi-reference circuit 32 provides either a first reference signal or a second reference signal to comparator circuit 30 as a function of the logic level of the output signal on a line 36. The two reference signals are selected to create hysteresis in input circuit 12. One embodiment of multi-reference circuit 32 is described below in conjunction with FIG. 5.

The elements of input circuit 12 are interconnected as follows. Comparator circuit 30 is connected to receive the input signal at a N1 input node via a line 34. Comparator circuit 30 has a N2 input node connected to an output lead of multi-reference circuit 32 via a line 35. The output lead of comparator circuit 30 is connected to an input lead of multi-reference circuit 32 via line 36. Thus, multi-reference circuit 32 is connected to provide feedback to comparator circuit 30.

Figure 4:
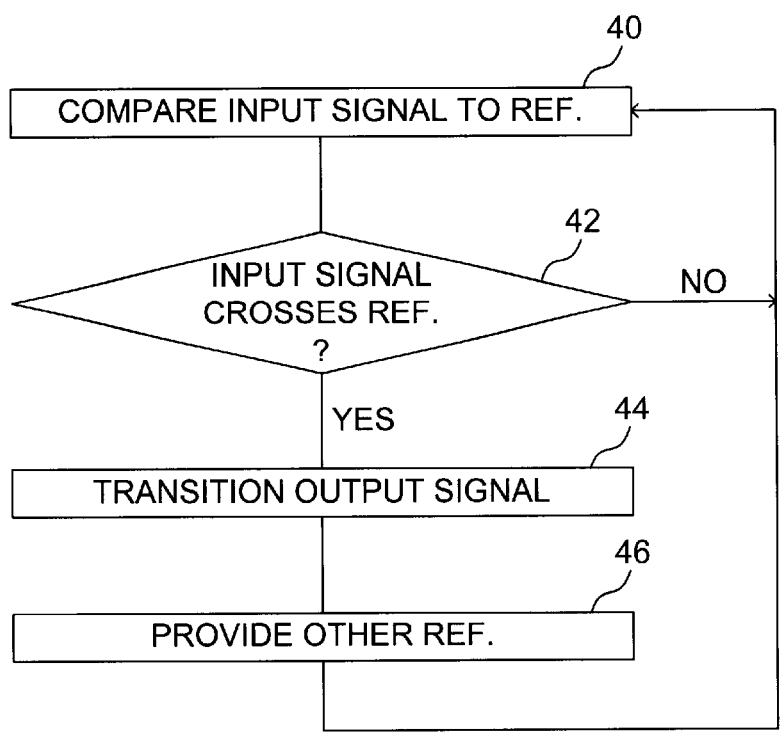
FIG. 4 is a flow diagram illustrating the operation of the input circuit depicted in FIG. 3, according to one embodiment of the present invention.

Referring to both FIG. 3 and the flow diagram of FIG. 4, input circuit 12 operates as follows. Input circuit 12 receives an input signal IN via line 34 and generates an output signal OUT as a function of the input signal via a line 36 and the reference signal received via line 35. As described above, multi-reference circuit 32 provides the reference signal with a level designed to create hysteresis. For example, when input signal IN is at a logic low level, the reference signal is at a relatively high level (REFH). Conversely, when input signal IN is at a logic high level, the reference signal has a relatively low level (REFL).

Comparator circuit 30 receives input signal IN at its N1 input node (via line 34) and a reference signal from multi-reference circuit 32 at its N2 input node (via line 35). Comparator circuit 30 compares the level of input signal IN to the level of reference signal to detect a transition of input signal's logic level (e.g., a low-to-high or a high-to-low logic level transition). In particular, comparator circuit 30 compares the levels to determine whether the level of input signal IN crosses that of the reference signal. The term "crosses" is used in this context to refer to the level of input signal IN either: (a) increasing from being less than to being greater than the level of the reference signal; or (b) decreasing from being greater than to being less than the level of the reference signal. This operation is illustrated as steps 40 and 42 in FIG. 4.

If comparator circuit 30 detects that the level of input signal IN does not cross that of the reference signal being received at its input node N2, comparator circuit 30 leaves its output signal unchanged. This operational flow is illustrated by the looping back to step 40 from step 42 if no crossing is detected in step 42.

Conversely, if comparator circuit 30 detects that the level of input signal IN crosses that of the reference signal being received at its input node N2, comparator circuit 30 causes a corresponding transition of output signal OUT at line 36. This operation is illustrated as a step 44 in FIG. 4, flowing from step 42. In this exemplary embodiment, comparator circuit 30 generates output signal OUT with the opposite logic level as that of input signal IN. In other embodiments, comparator circuit 30 can generate output signal OUT with the same logic level as that of input signal IN. Because comparator circuit 30 is differential in nature, input circuit 12 can operate faster than circuits that an input circuit that uses a single input signal. For example, input circuit 12 will generally be faster when the signals on node N1 and N2 of comparator circuit 30 are switching in opposite directions (i.e., one signal is increasing while the other is decreasing). Thus, comparator circuit 30 can be relatively fast (e.g., compared to Schmitt trigger circuits).

In response to the transition of output signal OUT, multi-reference circuit 32 provides the other reference signal to comparator circuit 30. For example, if prior to the transition of output signal OUT multi-reference circuit 32 was providing the reference signal at the REFL level, then a high-to-low transition of input signal IN that causes comparator circuit 30 to transition output signal OUT will in turn causes multi-reference circuit 32 to provide the reference signal at the REFH level. Conversely, if prior to the transition of output signal OUT multi-reference circuit 32 was providing the reference signal at the REFH level, then a low-to-high transition of input signal IN that causes comparator circuit 30 to transition output signal OUT will in turn causes multi-reference circuit 32 to provide the reference signal at the REFL level. This operation is illustrated in FIG. 4 as a step 46.

Input circuit 12 will then compare the level of input signal IN to the "new" level of the reference signal. This operational flow is illustrated by the looping back from step 46 to step 40.

Figure 5:
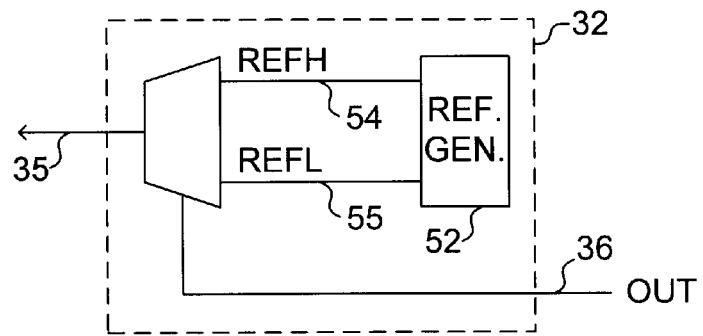
FIG. 5 is a diagram illustrating an implementation of the trip point circuit depicted in FIG. 3, according to one embodiment of the present invention.

FIG. 5 illustrates an implementation of multi-reference circuit 32 (FIG. 3), according to one embodiment of the present invention. This embodiment of multi-reference circuit 32 includes a multiplexer 51 and a reference generator 52. Reference generator 52 provides a reference signal REFH and a reference signal REFL. In this embodiment, reference signals REFH and REFL are reference voltages. In view of the present disclosure, those skilled in the art can design several suitable implementations of voltage reference generator 52 without undue experimentation. Multiplexer 51 operates to provide either reference signal REFH or reference signal REFL at its output lead, as a function of the logic level of the signal received at its control terminal. Any suitable multiplexer implementation can be used. One implementation is described below in conjunction with FIG. 6.

In this embodiment, the elements of multi-reference circuit 32 are interconnected as follows. Multiplexer 51 is connected to receive reference signals REFH and REFL from reference generator 52 via lines 54 and 55, respectively. The output lead of multiplexer 51 is connected to line 35, which is connected to input node N2 (FIG. 3) of comparator circuit 30 (FIG. 3). The control terminal of multiplexer 51 is connected to receive output signal OUT via line 36.

In operation, reference generator 52 generates reference signals REFH and REFL with levels that were predetermined to define the hysteresis of input circuit 12. Multiplexer 51 receives these reference signals from reference generator 52 at its input terminals via lines 54 and 55, along with output signal OUT at its control terminal via line 36. In response to the level of output signal OUT, multiplexer 51 provides either reference signal REFH or REFL to comparator circuit 30 (FIG. 3) via line 35. For example, if comparator circuit 30 (FIG. 3) generates output signal OUT as an inverted version of input signal IN, then a logic high level of output signal OUT will cause multiplexer 51 to provide reference signal REFH to comparator circuit 30 (FIG. 3). Thus, the level of input signal IN would have to exceed the level of reference signal REFH to cause comparator circuit 30 (FIG. 3) to transition output signal OUT to a logic low level.

Conversely, a logic low level of output signal OUT will cause multiplexer 51 to provide reference signal REFL to comparator circuit 30 (FIG. 3). Thus, the level of input signal IN would have to drop below the level of reference signal REFL to cause comparator circuit 30 (FIG. 3) to transition output signal OUT to a logic high level.

One of the advantages of this implementation is that input circuit 12 has relatively good PVT performance. One reason for this is that input circuit 12 includes a reference generator. Voltage generators typically have very accurate temperature compensation and low sensitivity to process variations and supply voltage noise. Thus, reference generator 52 can provide reference signals REFH and REFL with very accurate levels over a wide PVT variation. Accordingly, this embodiment of input circuit 12 tends to be relatively temperature and voltage insensitive when compared to input circuits that do not use reference generators (e.g., Schmitt triggers).

Figure 6:
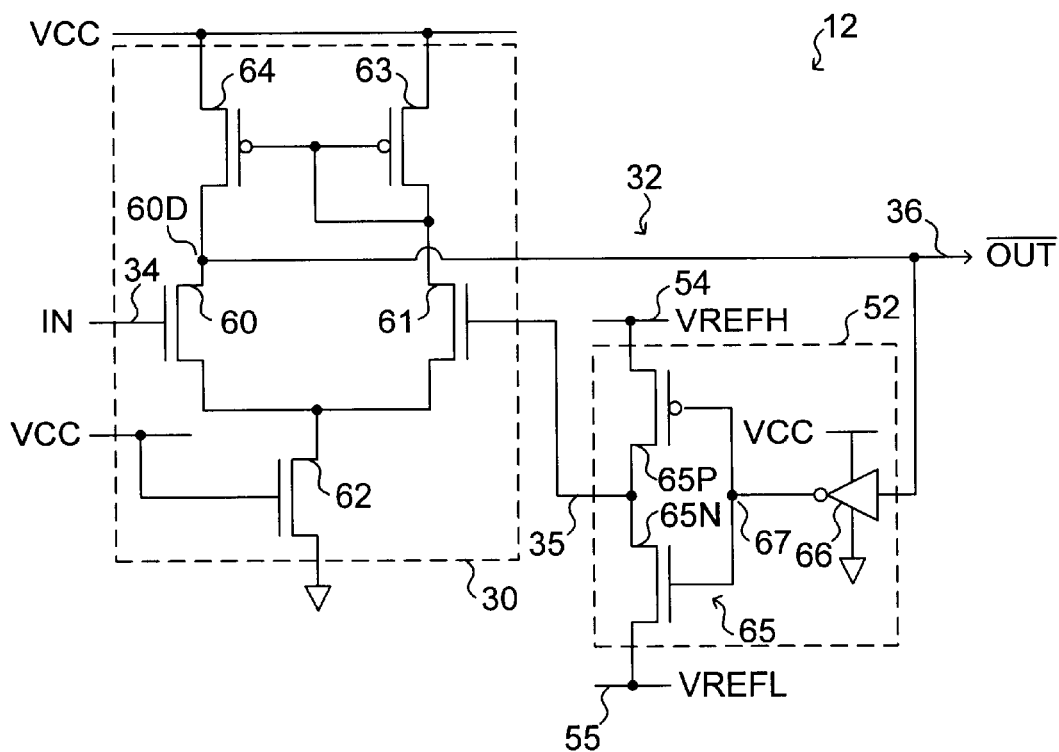
FIG. 6 is a schematic diagram illustrating an implementation of the input circuit of FIG. 3, according to one embodiment of the present invention.

FIG. 6 schematically illustrates an implementation of input circuit 12 (FIG. 3), according to one embodiment of the present invention. In this embodiment, comparator circuit 30 (FIG. 3) includes N-channel transistors 60, 61, and 62 and P-channel transistors 63 and 64. N-channel transistors 60 and 61 are connected as a differential pair (i.e., having their sources connected together and their gates connected to receive input signals). In particular, the gates of N-channel transistors 60 and 61 are respectively connected to receive input signal IN and the reference signal from multi-reference circuit 32 via line 35. The sources of N-channel transistors 60 and 61 are connected to the drain of N-channel transistor 62. The drains of N-channel transistors 60 and 61 are connected to a current mirror formed by P-channel transistors 64 and 65. The drain of N-channel transistor 60 (indicated in FIG. 6 as a node 60D) is connected to line 36, with its voltage level serving as output signal OUT. Further, N-channel transistor 62 has its gate and source respectively connected to the VCC bus and the ground bus, serving as a current source for the differential pair formed by N-channel transistors 60 and 61.

In this embodiment, multi-reference circuit 32 includes inverters 65 and 66. FIG. 6 illustrates the implementation of inverter 65; namely P-channel transistor 65P and N-channel transistor 65N. In particular, P-channel transistor 65P has its source, gate and drain connected to line 54, a node 67 and line 35, respectively. Line 54 provides a reference voltage VREFH from reference generator 52 (FIG. 5). N-channel transistor 65N has its source, gate and drain connected to line 55, node 67 and line 35. Line 55 provides a reference voltage VREFL from reference generator 52 (FIG. 5). Reference voltages VREFH and VREFL are preselected to have levels that are less than that of the VCC voltage and greater than the VSS voltage (also referred to herein as ground potential). For example, in one embodiment, reference voltages VREFH and VREFL are respectively about 1.2 volts and 0.3 volts, when using a 1.5 volt power supply. Thus, transistors 65P and 65N form a reduced-swing inverter, outputting either reference voltage VREFH or VREFL in response to the logic level at node 67. In other embodiments, reference voltages VREFH and VREFL can be set at other levels that meet the following three requirements to facilitate interoperability with comparator circuit 30. First, reference voltage VREFH should be more than a P-channel threshold voltage (Vtp) below the VCC voltage level. Second, reference voltage VREFL should be more than a N-channel threshold voltage (Vtn) above the VSS voltage level (i.e., ground potential). Third, the difference between reference voltages VREFH and VREFL should be greater than or equal to the sum of the magnitudes of Vtn and Vtp.

Inverter 66 has its input and output leads connected to line 36 and node 67, respectively. In this embodiment, inverter 66 is implemented as a standard CMOS (complementary symmetry metal-oxide semiconductor) inverter connected between the VCC and ground buses. The transistors implementing inverter 66 are omitted to improve clarity; however, the connections to the VCC and ground buses are shown to indicate that inverter 66 provides a full rail-to-rail output signal. The operation of this embodiment of input circuit 12 is described below in conjunction with FIG. 7, which illustrates the timing of input circuit 12 (FIG. 6) by way of a voltage versus time graph.

Figure 7:
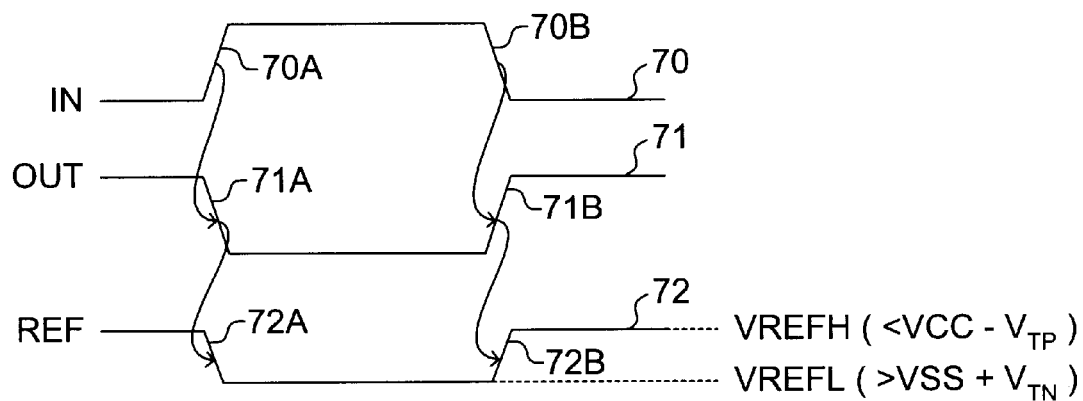
FIG. 7 is a timing diagram illustrating the operation of input circuit depicted in FIG. 6.

Referring to FIGS. 6 and 7, input circuit 12 operates as follows. Input signal IN, output signal OUT and reference signal REF are represented in FIG. 7 by waveform 70, waveform 71 and waveform 72, respectively. Starting with input signal IN being at a steady state logic low level, output signal OUT is at a logic high level and the signal REF from multi-reference circuit 32 is at the VREFH level. For purposes of this description, this is the initial state of input circuit 12.

When the level of input signal IN increases to cross the VREFH level, as indicated by edge 70A of waveform 70, the differential pair formed by N-channel transistors 60 and 61 pull down the voltage level at node 60D, thereby causing output signal OUT to transition to a logic low level, as indicated by an edge 71A of waveform 71. In this operational phase, voltage levels of input signal IN that are below the VREFH level do not cause a transition of output signal OUT. In response to output signal OUT transitioning to the logic low level, inverter 66 outputs a logic high level signal to reduced-swing inverter 65. Consequently, P-channel transistor 65P is turned off and N-channel transistor 65N is turned on. Thus, N-channel transistor 65N pulls down the voltage level of reference signal REF on line 35 to that of reference voltage VREFL, as indicated by edge 72A of waveform 72. As illustrated by the "overlap" of edges 70A with edge 71A, input signal IN and reference signal REF are switching in opposite directions (as described above in conjunction with FIG. 3) before output signal OUT is fully switched. Thus, the speed at which edge 71A of output signal OUT is generated relative to edge 70A of input signal IN is typically faster than can be achieved using other conventional circuits. This faster operation (i.e., small propagation delay) is desirable in many applications.

When the level of input signal IN decreases to cross the VREFL level (which is below the VREFH level), as indicated by edge 70B of waveform 70, the differential pair formed by N-channel transistors 60 and 61 causes the voltage level at node 60D to increase. This increase in the voltage level at node 60D results in output signal OUT transitioning to a logic high level, as indicated by an edge 71B of waveform 71. In this operational phase, voltage levels of input signal IN that are above the VREFL level do not cause a transition of output signal OUT. In response to output signal OUT transitioning to the logic high level, inverter 66 outputs a logic low level signal to reduced-swing inverter 65. Consequently, N-channel transistor 65N is turned off and P-channel transistor 65P is turned on. Thus, P-channel transistor 65 pulls up the voltage level of reference signal REF on line 35 to that of reference voltage VREFH, as indicated by edge 72B of waveform 72. Input circuit 12 is thus placed back in the initial state described above.

Figure 8:
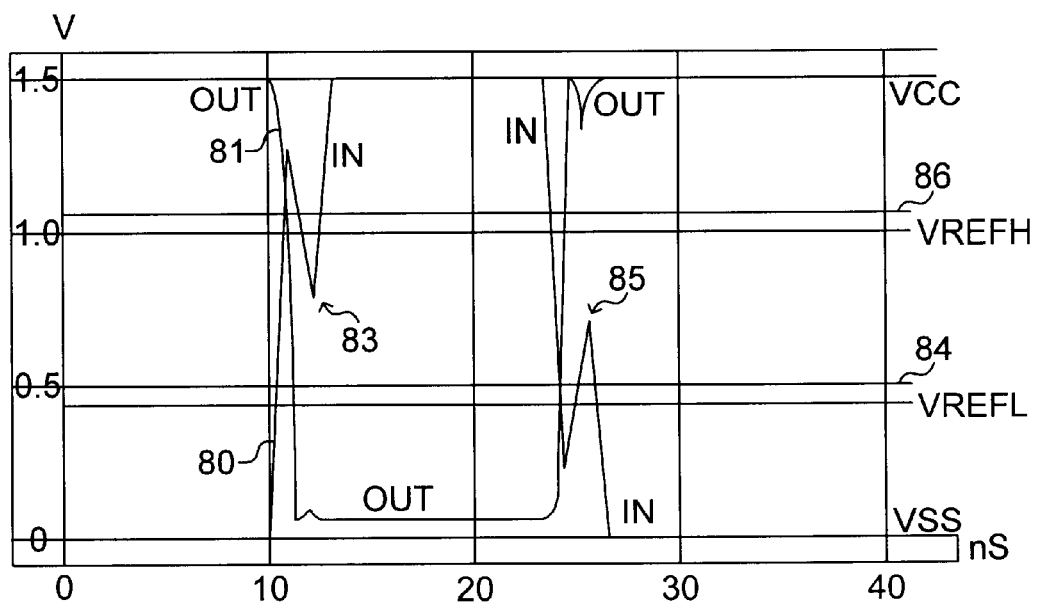
FIG. 8 is a timing diagram illustrating in more detail the response of the input circuit depicted in FIG. 6.

FIG. 8 illustrates in more detail the response of input circuit 12 (FIG. 6) to transitions of input signal IN by way of a voltage versus time graph. Input signal IN is represented by a waveform 80 and output signal OUT is represented by a waveform 81. In an initial state, input signal IN is a logic low level and output signal OUT is at a logic high level. In this example, input signal IN begins a low-to-high transition at about the ten nanosecond mark of the graph. In response to the transition of input signal IN, output signal OUT begins a high-to-low transition slightly after the ten nanosecond mark, which essentially completes at about the eleven nanosecond mark. In addition, between the eleven and twelve nanosecond marks, input signal IN experiences a glitch, as indicated by an arrow 83. This glitch reduces the level of input signal IN to a minimum of about 0.7 volts. However, there is essentially no change in output signal OUT due to this glitch because the local minimum of this glitch did not drop below the level of reference voltage VREFL, which is indicated by a horizontal line 84 at about 0.45 volts in this example.

Then, in this example, input signal IN begins a high-to-low transition at about the twenty-three nanosecond mark of the graph. In response to this transition of input signal IN, output signal OUT begins a low-to-high transition slightly after the twenty-three nanosecond mark, which essentially completes at about the twenty-four nanosecond mark. In addition, between the twenty-three and twenty-four nanosecond marks, input signal IN experiences a glitch, as indicated by an arrow 85. This glitch increase the level of input signal IN to a maximum of about 0.7 volts. However, there is essentially no change in output signal OUT due to this glitch because this local maximum of the glitch did not rise above the level of reference voltage VREFH, which is indicated by a horizontal line 86 at about 1.05 volts in this example. Thus, this embodiment of input circuit 12 also achieves a significant decrease in input noise sensitivity.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A circuit, comprising:
    a comparator circuit having a first input node coupleable to receive an input signal and having a second input node coupleable to receive a reference signal, the comparator circuit to generate an output signal having a level that is dependent on the input signal and the reference signal;

a first reference generator to generate a first signal;
a second reference generator to generate a second signal; and
a multiplexer having a control lead, a first input lead, a second input lead, and an output lead, the control lead coupled to receive the output signal, the first and second input leads coupled to the first and second reference generators, and the output lead of the multiplexer coupled to the second input node of the comparator circuit, wherein the multiplexer to output the reference signal, wherein the multiplexer comprises a reduced-swing inverter.

2. The circuit of claim 1, wherein the comparator circuit comprises a pair of transistors coupled to form a differential pair, one transistor of the differential pair coupled to the first input node and the other transistor of the differential pair coupled to the second input node.

3. The circuit of claim 1, wherein the multiplexer to select the first signal to serve as the reference signal when the output signal is at one level and to select the second signal to serve as the reference signal when the output signal is at another level.

4. The circuit of claim 1, wherein a change in the level of the input signal causes a change in the level of the reference signal in an opposite direction.

5. The circuit of claim 1, wherein the reduced-swing inverter having an output lead coupled to the second input node.

6. The circuit of claim 1, wherein the reduced-swing inverter comprises:
a P-channel transistor having a source, a gate and a drain, the source of the P-channel transistor coupled to receive a voltage of a first level and the drain of the P-channel transistor coupled to the second input node; and
a N-channel transistor having a source, a gate and a drain, the gate and drain of the N-channel transistor coupled to the gate an drain of the P-channel transistor, the source of the N-channel transistor coupled to receive a voltage of a second level, the second level being less than the first level.

7. The circuit of claim 1, wherein the multiplexer further comprises second inverter having an input lead coupled to receive the output signal and having an output lead coupled to an input lead of the reduced-swing inverter.

8. A circuit, comprising:
comparator means, coupled to receive an input signal at a first input node and a reference signal at a second input node, for generating an output signal having a level that is dependent on the input signal and the reference signal; and
a multi-reference circuit, coupled to receive the output signal, to provide the reference signal, the reference signal having a level that is dependent on the level of the output signal, wherein the multi-reference circuit comprises a reduced-swing inverter.

9. The circuit of claim 8, wherein the comparator means comprises a pair of transistors coupled to form a differential pair, one transistor of the differential pair being coupled to the first input node and the other transistor of the differential pair being coupled to the second input node.

10. The circuit of claim 8, wherein the multi-reference means comprises a multiplexer and a reference generator, the reference generator to provide a first signal and a second signal to the multiplexer, the multiplexer to select the first signal when the output signal is at one level and to select the second signal when the output signal is at another level.

11. The circuit of claim 8, wherein the reduced-swing inverter having an output lead coupled to the second input node.

12. The circuit of claim 8, wherein the reduced-swing inverter comprises:
a P-channel transistor having a source, a gate and a drain, wherein the source of the P-channel transistor is connected to receive a voltage of a first level and the drain of the P-channel transistor is connected to the second input node; and
a N-channel transistor having a source, a gate and a drain, wherein the gate and drain of the N-channel transistor is connected to the gate and drain of the P-channel transistor, the source of the N-channel transistor is connected to receive a voltage of a second level, the second level being less than the first level.

13. A processor, comprising:
a comparator circuit having a first input node coupleable to receive an input signal and having a second input node coupleable to receive a reference signal, the comparator circuit to generate an output signal having a level that is dependent on the input signal and the reference signal;
a first reference generator to generate a first signal;
a second reference generator to generate a second signal; and
a multiplexer having a control lead, a first input lead, a second input lead, and an output lead, the control lead coupled to receive the output signal, the first and second input leads coupled to the first and second reference generators, and the output lead of the multiplexer coupled to the second input node of the comparator circuit, wherein the multiplexer to output the reference signal, wherein the multiplexer comprises a reduced-swing inverter.

14. The processor of claim 13, wherein the comparator circuit comprises a pair of transistors coupled to form a differential pair, one transistor of the differential pair being coupled to the first input node and the other transistor of the differential pair being coupled to the second input node.

15. The processor of claim 13, wherein the multiplexer to select the first signal when the output signal is at one level and to select the second signal when the output signal is at another level.

16. The processor of claim 13, wherein the reduced-swing inverter having an output lead coupled to the second input node, the reduced-swing inverter comprising:
a P-channel transistor having a source, a gate and a drain, the source of the P-channel transistor being connected to receive a voltage of a first level and the drain of the P-channel transistor being connected to the second input node; and
a N-channel transistor having a source, a gate and a drain, the gate and drain of the N-channel transistor being connected to the gate and drain of the P-channel transistor, the source of the N-channel transistor being connected to receive a voltage of a second level, the second level being less than the first level.

17. The processor of claim 13, wherein the multiplexer further comprises a second inverter having an input lead coupled to receive the output signal and having an output lead coupled to an input lead of the reduced-swing inverter.

18. A method, comprising:
comparing an input signal with a reference signal, the reference signal having a level;
causing a transition of an output signal in response to a crossing of the input signal and the reference signal; and causing the level of the reference signal to change in response to the transition of the output signal, wherein the reference signal outputted by a multi-reference circuit comprising a reduced-swing inverter.

19. The method of claim 18, wherein a differential pair is used to compare the input signal to the reference signal.

20. The method of claim 18, wherein the level of the reference signal is changed to a first level in response to the output signal transitioning to a first logic level and to a second level in response to the output signal transitioning to a second logic level.

21. An apparatus, comprising:
   means for receiving an input signal and a reference signal, the reference signal having a level;
   means for causing a transition of an output signal in response to a crossing of the input signal and the reference signal; and
   a reduced-swing inverter to cause the level of the reference signal to change in response to the transition of the output signal.

22. The apparatus of claim 21, wherein the first and second levels of the reference signal are voltage levels are less than a VCC voltage level and greater than a VSS level.

23. The apparatus of claim 21, wherein the level of the reference signal is changed to a first level in response to the output signal transitioning to a first logic level and to a second level in response to the output signal transitioning to a second logic level.

24. The apparatus of claim 23, wherein the level of the reference signal changes while the level of the input signal is changing.

25. The apparatus of claim 21, wherein the means for receiving comprises two transistors coupled to form a differential pair, one transistor of the differential pair being coupled to receive the input signal and the other transistor of the differential pair being coupled to receive the reference signal.

26. A computer system, comprising:
   an input circuit to receive an input signal and to generate an output signal in response to the input signal, wherein the input circuit comprises:
      comparator means, coupled to receive the input signal at a first input node and a reference signal at a second input node, for generating the output signal with a level that is dependent on the input signal and the reference signal; and
      a multi-reference circuit, including a reduced-swing inverter, coupled to receive the output signal, the multi-reference circuit to provide the reference signal, the reference signal having a level that is dependent on the level of the output signal.

27. The computer system of claim 26, wherein the comparator means comprises a pair of transistors coupled to form a differential pair, one transistor of the differential pair being coupled to the first input node and the other transistor of the differential pair being coupled to the second input node.

28. The computer system of claim 26, wherein the multi-reference means comprises a multiplexer and a reference generator, the reference generator to provide a first signal and a second signal to the multiplexer, the multiplexer to select the first signal when the output signal is at one level and to select the second signal when the output signal is at another level.

29. The computer system of claim 26, wherein the reduced-swing inverter having an output lead coupled to the second input node, the reduced-swing inverter comprising:
   a P-channel transistor having a source, a gate and a drain, the source of the P-channel transistor being connected to receive a voltage of a first level and the drain of the P-channel transistor being connected to the second input node; and
   a N-channel transistor having a source, a gate and a drain, the gate and drain of the N-channel transistor being connected to the gate and drain of the P-channel transistor, the source of the N-channel transistor being connected to receive a voltage of a second level, the second level being less than the first level.

* * * * *

UNITED STATES PATENT AND TRADEMARK OFFICE
CERTIFICATE OF CORRECTION

PATENT NO. : 6,781,428 B2  Page 1 of 1
DATED : August 24, 2004
INVENTOR(S) : Chao It is certified that error appears in the above-identified patent and that said Letters Patent is hereby corrected as shown below:

<u>Column 9,</u>
Line 38, delete "an" read insert -- and --.

Signed and Sealed this

Twenty-first Day of June, 2005

JON W. DUDAS
*Director of the United States Patent and Trademark Office*